Oct. 31, 1961 D. A. PAYNTER 3,007,045

CONVERTER

Filed Aug. 1, 1958

INVENTOR:
DONALD A. PAYNTER,
BY Joseph P. Kates
HIS ATTORNEY.

United States Patent Office 3,007,045
Patented Oct. 31, 1961

3,007,045

CONVERTER

Donald A. Paynter, Syracuse, N.Y., assignor to General Electric Company, a corporation of New York Filed Aug. 1, 1958, Ser. No. 752,576
9 Claims. (Cl. 250—20)

The present invention relates to a crystal controlled transistor converter and more particularly relates to a converter which will provide substantially improved conversion gain while utilizing a single transistor stage to function both as an oscillator and as a converter.

Prior art frequency converters utilizing transistors have been known, however, such converters had disadvantages in that some required the use of tetrode transistors and thus were dependent upon the four terminal type of transistors which required greater expense. Other transistor modulators as, for example, that of R. L. Wallace, Jr., described in Resissue Patent 24,183, were not crystal controlled and hence did not meet rigid requirements for close frequency tolerances over a relatively large range of ambient temperatures, and supply voltage, and they did not readily lend themselves to use in double conversion superheterodyne receivers because they required more than one stage for functioning as an oscillator and as a converter.

The present invention overcomes these and other disadvantages of the prior art and provides a crystal controlled converter wherein close tolerances of frequency and minimum performance changes with changes in ambient conditions of supply voltage and temperature will be effected, and which will provide for an economical circuit which may be operated with high stability at the mode of the crystal or at harmonics of that mode. The present invention performs with a single transistor a plurality of functions heretofore requiring at least two transistor circuits, and provides improved conversion gain.

Accordingly, an object of the present invention is to provide a transistor crystal controlled converter-oscillator which enables substantially improved conversion gain through maximum utilization of the input signal.

Another purpose of the present invention is to provide a crystal controlled transistor converter which will perform the functions of circuits heretofore performed utilizing more than one transistor circuit and wherein improved conversion gain results because of a low impedance path provided in the non-output signal developing portions of the circuitry.

Another aim of the present invention is to provide a crystal controlled transistor oscillator having other functions and which will be of stable configuration and closely controlled frequency output tolerance despite relatively wide variations in power supply and in ambient temperature.

Another object of the present invention is to provide a crystal controlled transistor converter which will have the advantages of a parallel crystal and resistor circuit disposed between the base and the emitter and yet which will have additional circuitry designed to provide a low impedance path to R-F frequency thereacross thereby reducing input R-F signal losses and hence maximizing I-F power output.

Another aim of the present invention is to provide a relatively simple transistor crystal controlled converter in which the input R-F losses are minimized resulting in increased conversion gain and which will utilize a minimum of expensive components.

Another purpose of the present invention is to provide a crystal controlled transistor converter which will be especially suitable for use in superheterodyne receivers and particularly in such receivers utilizing double conversion for step down conversion from a relatively high R-F frequency to a relatively low intermediate frequency.

Another object of the present invention is to provide a means and a method for combining functions of oscillation and conversion in a manner to increase efficiency and conversion gain.

While the novel and distinctive features of the invention are particularly pointed out in the appended claims, a more expository treatment of the invention, in principle and in detail, together with additional objects and advantages thereof, is afforded by the following description and accompanying drawings in which:

Figure 3:
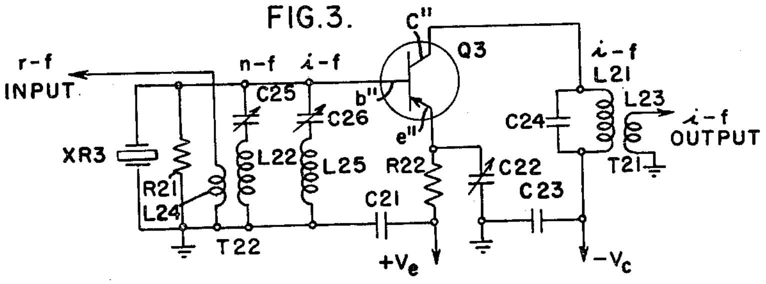
Figure 4:
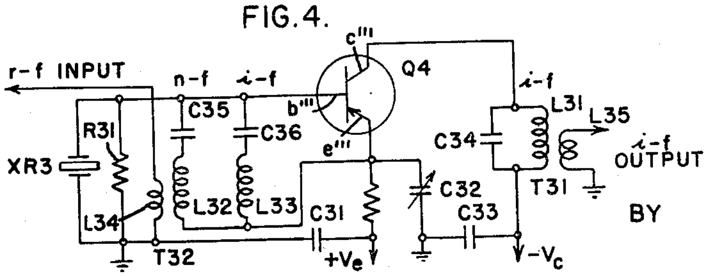

FIG. 3 is a schematic representation illustrative of still another embodiment of the present invention showing the modified crystal converter of the invention and wherein bypassing of both R-F and I-F at the inputs circuit is advantageously effected; and FIG. 4 is a schematic representation illustrative of another embodiment of the present invention wherein both intermediate frequency and radio frequency are bypassed and improved means of providing oscillator resonance are included.

The method and means of the present invention provide a relatively low impedance path at radio frequency externally of a signal translating device wherein mixing takes place and provides maximum signal development across the output circuit. It is contemplated that the oscillation frequency of the transistor circuit may considerably differ from the radio frequency in operation.

Figure 1:
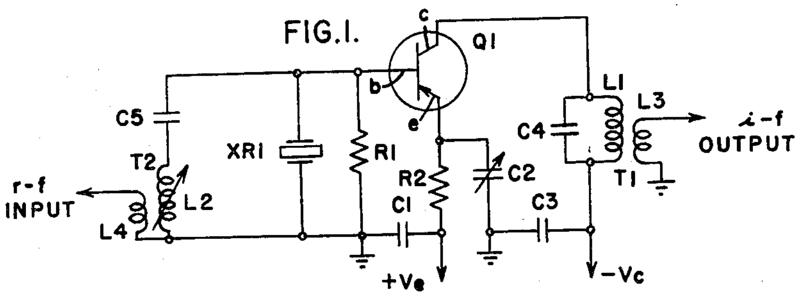
FIG. 1 is a schematic representation of a preferred embodiment of the crystal controlled transistor converter of the present invention.

Referring to the drawings and in particular to FIG. 1, a transistor Q1 may be provided which may be a triode junction transistor having electrode elements comprising an emitter *e*, a base *b*, and a collector *c*. Although a triode is preferable for circuit economy, a tetrode may also be used if desired. In each of FIGS. 1, 2, 3, and 4, the transistor provided may be a junction transistor. Disposed between the base and ground may be a crystal controlled input circuit comprising a crystal XR1 and a resistor R1 in parallel. Disposed in shunt with the crystal XR1 may be a second circuit series resonant to a predetermined R-F frequency which may comprise a variable inductor L2 and a capacitor C5 in series and disposed between the base *b* of the transistor Q1 and ground. Variable inductor L2 may comprise the secondary winding of an input transformer T2 which transformer may have a primary winding L4 to provide R-F input. Disposed between the emitter *e* and a source of positive voltage $V_e$ of value to provide a predetermined desired emitter current may be a resistor R2. R-F bypass may be provided between the source $V_e$ and ground by a bypass capacitor C1. A variable capacitor C2 may be provided between the emitter *e* of transistor Q1 and ground. Disposed between the collector *c* of transistor Q1 and a source of negative voltage, $-V_c$, of value selected for the particular transistor utilized may be an output tank circuit comprising an inductor L1 and a variable capacitor C4 in parallel. Together with inductor L1 to form a transformer T1 may be provided a secondary winding or inductor L3 to provide for an intermediate frequency (I-F) output. Disposed between the source of negative voltage minus $V_c$ and ground may be a bypass capacitor C3 to provide an A.-C. return path to ground. Output parallel tank circuit L1, C4 may be tuned for maximum power output at the I-F frequency, the circuit arrangement permitting compensation for load reactive effects.

Operation of the circuit of FIG. 1 occurs as follows:

The crystal input circuit may be operated by action of capacitor C2 in combination with the transistor such that the crystal operates between the series resonant mode and the parallel resonant mode in a manner similar to that described in the patent application, Serial No. 742,-941 of W. F. Chow, filed June 18, 1958, for Crystal Controlled High Frequency Transistor Oscillator and assigned to the General Electric Company. When operating at that mode either the crystal frequency or modes thereof or harmonics of the crystal or mode frequency may be developed in the output across the tuned circuit comprising capacitor C4 and inductor L1. As stated, capacitor C4 and inductor L1 may be tuned to harmonics of the crystal frequency as described in the above-described application for Letters Patent. Intermediate frequency (I-F) output may be taken across secondary winding L3, tuning as hereinbefore stated being effected for maximum output at the I-F frequency. The circuit comprising the crystal XR1 and resistor R1 in parallel across the base to emitter circuit, the emitter circuit and the collector circuit will provide for oscillation. In order to provide an R-F input signal so as to enable converter action, the input R-F transformer T2 will couple radio frequency input from the primary winding L4 to the secondary winding L2. The series resonant circuit comprising inductor L2 and capacitor C5 may be tuned by means of variable inductor L2 to the R-F frequency. Capacitor C5 and inductor L2 being a series resonant circuit tuned to the R-F frequency there will be thereby provided a very low impedance path at R-F frequency between the base of transistor Q1 and ground to thereby provide a minimum loss of R-F signal across the input circuit. The series input circuit comprising capacitor C5 and inductor L2 will not effect the operation of the crystal input circuit and will not load the crystal so long as the radio frequency is substantially removed from the frequency of oscillation of the crystal. Thus, because the impedances at radio frequency across the input circuit comprising capacitor C5 and inductor L2 and at the emitter circuit across resistor R2 and capacitor C2 are relatively very small, the greatest portion of the radio frequency signal will occur across the semiconductor Q1 between the base and emitter of the transistor circuit. Since practically the entire portion of the output impedance comprising capacitor C4 and inductor L1 in parallel is disposed between the collector and emitter, mixing or heterodyning will be effected between the base and emitter of transistor Q1. The four signals comprising the R-F signal, the oscillator generated signal, the difference signal, and the sum signal between the first-mentioned two signals may be amplified across the transistor. The output circuit comprising capacitor C4 and inductor L1 being tuned to the intermediate frequency which, for example, may be the difference frequency in one preferred embodiment although the sum frequency could be used for other applications, substantially the entire signal will be developed across the output load comprising capacitor C4 and inductor L1, and the reflected load of the inductor L3. The operating voltages ($V_e$ and/or minus $V_c$) should be chosen so that the input diode effected between the emitter and base is operated on the characteristic current voltage curve at a point very near to the point of greatest non linearity of the input diode. However, the voltages are carefully chosen also with regard to amplification of the I-F signals so that a compromise is effected and a point is selected substantially near but toward the region of greater amplification in relative position to the point of greatest non linearity. This provides for selection of the optimum point for maximum conversion gain.

Figure 2:
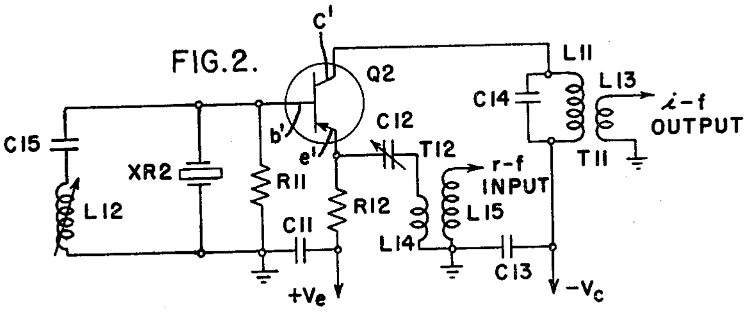
FIG. 2 is a second embodiment of the crystal controlled transistor converter of the present invention showing a schematic representation illustrative of a form of the present invention wherein injection of the R-F input signal is effected in the emitter to ground circuit.

Referring to FIG. 2, a transistor converter is provided comprising a transistor Q2 which may have a collector $c'$, an emitter $e'$ and a base $b'$. Disposed between the collector $c'$ and a source of collector voltage which may be a negative source ($-V_c$) depending upon whether an NPN or PNP transistor is utilized for the circuit of transistor Q2 may be a parallel tank circuit tuned to an intermediate frequency comprising variable capacitor C14 and inductor L11. Inductor L11 together with inductor L13 may form a transformer T11 to provide for transformer coupling of I-F (intermediate frequency) output to following stages. Disposed between the emitter $e'$ and a source of positive voltage $V_e$ which may be chosen for biasing for maximum conversion in a manner similar to that described for the circuit of FIG. 1, may be an emitter resistor R12. Disposed between the emitter and ground may be a variable capacitor C12 and an inductor L14 in series for a purpose to be described. An inductor L15 is provided which in conjunction with inductor L14 will provide an input transformer T12 for providing R-F (radio frequency) input to the circuit. Disposed between the base $b'$ of transistor Q2 and ground may be a parallel circuit comprising a crystal XR2 and a resistor R11 to form the crystal input circuit. The crystal may be operated at a point between the parallel resonant mode and the series resonant mode of the crystal. Across the crystal may be a series circuit comprising a capacitor C15 and a variable inductor L12. Capacitor C15 and inductor L12 may be resonant at the R-F frequency to provide for low impedance between the base $b'$ of transistor Q2 and ground to thereby provide for minimum power loss of the R-F signal in providing for maximum heterodyned output of the converter. Capacitor C12 and inductor L14 may be tuned by varying capacitor C12 to series resonance at the radio frequency (R-F). However, since the circuit must act as an oscillator as well as a converter, this requires that capacitor C12 also be tuned in accordance with the operation at the desired mode frequency of operation of the input crystal circuit. For these reasons a compromise must be effected between series resonance of the circuit at the R-F frequency of the circuit comprising capacitor C12 and inductor L14 and the desired capacitance for optimum desired operation of the input circuit to provide for maximum oscillation at the oscillating frequency of the crystal. Therefore, the characteristics of the secondary winding L14 of transformer T12 must be chosen so as to be series resonant with the value of capacitance of the capacitor C12 which will provide for resonance of the input circuit. Since the inductance of inductor L14 cancels some of the capacitance of capacitor C12 looking into the input crystal circuit, the capacitance of capacitor C12 must be increased to allow for compensation for required characteristics. The capacitor C12 must therefore be of such size as to satisfy oscillating characteristics and also with the inductor must form a series resonant circuit to the R-F input frequency. The circuit of FIG. 2 operates as follows:

Oscillation is performed in a manner similar to the patent application of Chow hereinbefore described assuming that the series resonant circuit of capacitor C12 and inductor L14 is capacitive looking into the input crystal circuit. When energy at radio frequency is introduced across the pirmary L15 of transformer T12 and coupled to the secondary L14 radio frequency energy will be introduced into the transistor Q2 at the emitter $e'$. The oscillator frequency is also present between the base $b'$ and the emitter $e'$ of the transistor Q2 and beats with the R-F frequency introduced across emitter $e'$ and the base $b'$. In a manner similar to the behavior of capacitor C5 and inductor L2 of FIG. 1, the series resonant circuit capacitor C15 and variable inductor L12 provides for very low impedance at the R-F frequency thereby providing for very low loss of R-F signal power in the input circuit. The substantial portion of the R-F frequency energy is thereby developed across the input diode comprising the base $b'$ to the emitter $e'$. The sum and difference frequencies and the original R-F and oscillator frequencies will thereby appear between the base $b'$ and the emitter $e'$ of transistor Q2 and will be amplified to provide an amplified output at the collector $c'$. The output circuit being tuned to the sum or difference frequency as desired, for example, at the difference frequency there will be provided maximum output across the output parallel I-F resonant circuit if the output tank is tuned to the difference frequency. Capacitor C11 and capacitor C13 provide for A.-C. grounding in a manner similar to the capacitor C1 and capacitor C3 of FIG. 1. Because of the fact that the circuit of FIG. 2 may provide for a lower impedance from the emitter to ground at the R-F frequency this circuit makes it possible to develop the greater portion of the R-F input signal across the input diode comprising the emitter $e'$ to base $b'$ circuit internal to the transistor. While it is in nowise intended to limit the invention to this configuration, in experimental use of the device of FIG. 2 on operating with a 43 mc. crystal, a 2N247 transistor, a 50 mc. R-F input signal, and 7 mc. output I-F there was indicated an increase of output of more than 12 db (decibels) over the same circuit without the series resonant circuit L12, C15. The circuit of FIG. 1 exhibited similar conversion capabilities in test.

Referring now to FIG. 3 of the drawings, a transistor Q3 may be provided having a base $b''$, a collector $c''$, and an emitter $e''$. Disposed between the emitter $e''$ and a source of positive voltage for desired emitter current may be an emitter resistor R22. Disposed between the emitter and ground may be a variable capacitor C22 which may provide for operation of the input circuit in a manner to be described. Disposed between the collector $c''$ and a source of collector voltage, minus $V_c(-V_c)$, may be an output tank circuit tuned to the intermediate frequency impedance. The output tank circuit may comprise a capacitor C24 and an inductor L21. Inductor L21 may constitute the primary winding of an output transformer T21 for output transformer coupling, the secondary winding of which transformer T21 may comprise inductor L23. Inductor L23 may be grounded at one end thereof. Disposed between the end of the tank circuit C24 and L21 adjacent voltage source $-V_c$ may be a capacitor C23 to provide an A.-C. return path. Disposed between the base $b''$ of transistor Q3 and ground may be a first series circuit comprising a capacitor C26 and an inductor L25 which may be series resonant tuned to the I-F frequency of the converter and a second series resonant circuit comprising a capacitor C25 and an inductor L22 which may be tuned to the R-F input frequency which beats with the oscillator frequency of the transistor oscillator to form the difference and sum of R-F and I-F frequencies in a manner to be described. Inductor L22 of the R-F tuned series input resonant circuit disposed between the base $b''$ and ground may be the secondary of a transformer T22 which transformer may have a primary winding L24 to provide for input coupling of the R-F input signal into the circuit. Disposed between the base $b''$ of transistor Q3 and ground may be a parallel combination of a crystal XR3 and a resistor R21 to provide an input crystal circuit which may be operated between the series resonant mode and the parallel resonant mode of the crystal.

Turning now to the embodiment of FIG. 4 of the drawings, one end of inductor L32 may be jointed to a corresponding end of inductor L33 opposite the ends connected respectively to capacitors C35 and C36 and the junction of the inductors L32 and L33 may be directly connected to the emitter $e'''$ of transistor Q4. Operation of this modification will be described hereinbelow. Now, discussing operation of the embodiment of FIG. 3, the crystal XR3 and the resistor R21 may be operated at a mode between the series resonant and the parallel resonant modes of the crystal. Oscillation will occur substantially as in the embodiment in FIG. 1. Radio frequency input may be provided across the primary L24 of the transformer T22 and may be coupled to the secondary L22. The input R-F series resonant circuit comprising capacitor C25 and inductor L22 provides a very low impedance at the external input circuit to the radio frequency signal thereby insuring that the signal will substantially appear between the emitter $e''$ and the base $b''$ internally in transistor Q3. In addition, the series resonant circuit comprising capacitor C26 and inductor L25 which is tuned to resonance at the intermediate frequency will provide a very low impedance path for the I-F energy at the external input circuit thereby providing for maximum development of the I-F frequency components at the input diode comprising an emitter $e''$ and base $b''$. The series resonant circuits at the R-F frequency comprising capacitor C25 and inductor L22 and the I-F circuit comprising capacitor C26 and inductor L25 being operated at frequencies substantially different from the crystal operated frequency will not appreciably affect the input crystal circuit or each other. The output of intermediate frequency which may be the sum or difference frequency between the radio frequency and crystal oscillator frequency as desired may be developed across the output high impedance parallel resonant circuit comprising capacitor C24 and inductor L21. This intermediate frequency output may be transmitted by transformer coupling in transformer T21 to the stages following the converter stage Q3. Capacitor C24 may provide for bypassing A.-C. to thereby provide an A.-C. ground. In the modification shown in FIG. 4 as stated hereinabove the ends of inductor L32 and inductor L33 may be tied together and tied to the emitter $e'''$. This improvement eliminates the effects of capacitive reactance of capacitor C22 in the circuit of FIG. 3. Capacitor C32 may thereby be enabled to provide the necessary capacitive reactance to make the input circuit of crystal XR3 and resistor R31 resonant at the desired mode of operation while insuring that there is no adverse gain effect caused by the input I-F and R-F series resonant circuits.

While not intended to be limiting as to the invention, the following component values are representative of a successfully tested embodiment of the circuit of FIG. 1, transistor=2N247, C5=3 μμf., L2 of transformer T2=2 to 5 microhenries, crystal was a 43 megacycle crystal, R1=4.3K ohms, R2=4.3K ohms, C1=.001 microfarad, C2=5 to 80 micromicrofarads, C3=.001 microfarad, C4=5 to 80 micromicrofarads, L1=20 microhenries, $V_e=+5$ volts, $-V_c=-15$ volts, input R-F was 50 megacycles, output I-F=7 megacycles.

While the principles of the invention have now been made clear, there will be immediately obvious to those skilled in the art many modifications in structure, arrangement, proportions, the elements and components used in the practice of the invention, and otherwise, which are particularly adapted for specific environments and operating requirements without departing from those principles. The appended claims are therefore intended to cover and embrace any such modifications within the limits only of the true spirit and scope of the invention.

What is claimed is:

1. A single stage combined converter and oscillator, said stage comprising a junction transistor including an input diode, means to couple radio frequency energy into said input diode, means to transmit radio frequency energy into said coupling means, crystal controlled circuit means disposed in shunt with said input diode, means to operate said transistor to cause oscillations, said oscillations being combined with said radio frequency input in said input diode to cause output at an intermediate frequency, said crystal controlled circuit means causing oscillations within close tolerances, said means to couple in radio frequency energy comprising a first inductor and a capacitor in series, said series inductor and capacitor being resonant to said radio frequency to form minimum impedance at radio frequency whereby maximum impedance to radio frequency energy and hence maximum radio frequency signal development takes place in said input diode to thus insure that maximum radio frequency energy is mixed with the oscillator frequency energy.

2. The apparatus of claim 1 wherein said means to transmit radio frequency energy into said coupling means includes a second inductor in transformer-coupled association with said first inductor to form an input transformer and wherein one end of said series circuit is grounded, said crystal-controlled circuit comprising a capacitor disposed between the emitter of said transistor and ground to cause the circuit to be operated between the series resonant and parallel resonant mode in causing oscillation, said crystal-controlled circuit and said series circuit thereby causing minimum radio frequency energy development externally of said transistor.

3. A junction transistor combined converter and oscillator, said transistor comprising a first and second electrode element, the portion of said transistor between said first and second electrode elements defining a non-linear element, an input crystal controlled impedance circuit connected between said electrode elements and operated between the series resonant mode and the parallel resonant mode to cause oscillation through an internal feedback path in said transistor, a series reactive circuit of reactance value to be resonant at a predetermined radio frequency, said series circuit being coupled between said first and second electrode elements and across said non-linear element, means to couple radio frequency into said reactive circuit for producing maximum current flow therein, said radio frequency and said oscillations beating together in the non-linear element of said transistor between said electrode elements to provide an intermediate frequency output and transistor output load impedance means tuned to said intermediate frequency.

4. A single stage oscillator and converter comprising a junction transistor, a portion of said transistor defining a non-linear diode element, means to bias said transistor, an input crystal circuit, means to operate said crystal circuit in combination with said transistor to sustain oscillations at a predetermined desired oscillator frequency, a circuit series resonant to a radio frequency which is substantially removed from said oscillator frequency disposed across said non-linear diode of said transistor, means to couple radio frequency energy into said series resonant circuit whereby mixing of said radio frequency energy and said oscillator takes place in said diode element, and output means tuned to a frequency representing a combination of said radio frequency and said oscillating frequency.

5. The apparatus of claim 4 wherein said series resonant circuit is disposed between the base of said transistor and ground and said means to operate said crystal circuit in combination with said transistor is disposed between the emitter of said transistor and ground.

6. The apparatus of claim 4 wherein said series resonant circuit is disposed between the base of said transistor and ground and including a circuit disposed across said input diode and series resonant to said combination frequency.

7. The apparatus of claim 6 wherein said combination frequency series resonant circuit is disposed between the base of said transistor and ground.

8. The apparatus of claim 4 wherein said combination frequency series resonant circuit is connected externally of said transistor and on one side to the base and on the other side to the emitter of said transistor.

9. A crystal controlled transistor converter comprising a transistor including an emitter, a collector, and a base, the portion of said transistor between said base and said emitter defining a non-linear diode element, an input crystal-controlled circuit operated between the series resonant and the parallel resonant mode disposed between the base of said transistor and ground, an output circuit tuned to an intermediate frequency, an input circuit having radio frequency impressed thereon and coupled between the base of said transistor and ground, and frequency sensitive means to provide for substantially minimum impedance at the frequency of said radio frequency input, said frequency sensitive means being coupled across said non-linear element between the base and the emitter of said transistor to thereby insure that maximum impedance at the R-F frequency between the base and the emitter will be provided internally of the transistor to provide for maximum signal development across the internal emitter to base impedance.

References Cited in the file of this patent

UNITED STATES PATENTS

| | | |
|---|---|---|
| 1,938,640 | Posthumus | Dec. 12, 1933 |
| 2,278,030 | Weber | Mar. 31, 1942 |
| 2,570,436 | Eberhard et al. | Oct. 9, 1951 |
| 2,774,866 | Burger | Dec. 18, 1956 |
| 2,775,705 | Van Oberbeck | Dec. 25, 1956 |
| 2,789,213 | Marks et al. | Apr. 16, 1957 |
| 2,878,376 | Stern | Mar. 17, 1959 |
| 2,887,573 | Hruska | May 19, 1959 |